(12) United States Patent
Sakai

(10) Patent No.: US 6,841,840 B2
(45) Date of Patent: Jan. 11, 2005

(54) CAPACITIVE DYNAMIC QUANTITY SENSOR

(75) Inventor: Minekazu Sakai, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/616,205

(22) Filed: Jul. 10, 2003

(65) Prior Publication Data

US 2004/0207034 A1 Oct. 21, 2004

(30) Foreign Application Priority Data

Aug. 7, 2002 (JP) ........................................ 2002-230354

(51) Int. Cl.$^7$ ............................................ H01L 29/82
(52) U.S. Cl. ........................ 257/420; 257/414; 257/415
(58) Field of Search ................................ 257/414–415, 257/417–420; 73/715

(56) References Cited

U.S. PATENT DOCUMENTS

| 5,932,332 | A | * | 8/1999 | Pandorf et al. ............. 428/220 |
| 6,296,779 | B1 | * | 10/2001 | Clark et al. .................... 216/66 |
| 6,450,031 | B1 | | 9/2002 | Sakai et al. |
| 6,467,348 | B1 | | 10/2002 | Song et al. |
| 6,550,337 | B1 | * | 4/2003 | Wagner et al. ................ 73/715 |
| 6,657,442 | B1 | * | 12/2003 | Seppa et al. ................ 324/661 |

FOREIGN PATENT DOCUMENTS

| JP | A-2000-292174 | 10/2000 |
| JP | A-2002-0022453 | 1/2002 |

* cited by examiner

Primary Examiner—Ori Nadav
(74) Attorney, Agent, or Firm—Posz & Bethards, PLC

(57) ABSTRACT

A capacitive dynamic quantity sensor includes a substrate, a weight, a movable electrode, an anchor, a fixed electrode, a spring, and a strain buffer. The weight is displaced by a dynamic quantity. The movable electrode is integrated with the weight. The anchor is fixed to the substrate to suspend the weight and the movable electrode above the substrate. The fixed electrode is arranged to face the movable electrode. The displacement of the movable electrode caused in response to the dynamic quantity is detected as a capacitance variation between the electrodes. The spring is located between the anchor and the weight and resiliently deforms in response to the dynamic quantity such that the movable electrode is displaced by a distance corresponding to the dynamic quantity. The strain buffer is located between the anchor and the spring to reduce the influence of a strain generated in the substrate on the spring.

6 Claims, 4 Drawing Sheets

CAPACITIVE DYNAMIC QUANTITY SENSOR

CROSS REFERENCE TO RELATED APPLICATION

This application is based on and incorporates herein by reference Japanese Patent Application No. 2002-230354 filed on Aug. 7, 2002.

BACKGROUND OF THE INVENTION

The present invention relates to a capacitive dynamic quantity sensor.

For example, a capacitive semiconductor acceleration sensor 27, or sensor chip 27, shown in FIG. 4A is such a capacitive dynamic quantity sensor. As shown in FIG. 4A, in the sensor chip 27, a weight 11 is supported by movable unit anchors 14 through springs 12, which are expandable and shrinkable. First and second comb-tooth-like movable electrodes 10a, 10b are integrated with the weight 11. As illustrated in FIG. 4A, first and second comb-tooth-like fixed electrodes 17a, 17b, which respectively face the first and second movable electrodes 10a, 10b, are supported at one ends thereof by fixed unit anchors 19a, 19b.

For example, the sensor chip 27 is fixed to a sensor package 29 with an adhesive 28, and the sensor package 29 is bonded onto a printed circuit board 31 with another adhesive 30 such as solder, as shown in FIG. 4B. The printed circuit board 31, on which the sensor chip 27 and so on has been mounted, is fixed to a vehicle at a predetermined position using a fixer such as a screw.

However, because the printed circuit board 31, the sensor package 29, the adhesives 28, 30, and the sensor chip 27 are different in linear expansion coefficient, a deformation such as a warp can be generated in the semiconductor substrate of the sensor chip 27. If the deformation is generated in the semiconductor substrate, the strain generated by the deformation is transmitted to the springs 12 through the movable unit anchors 14, which are connected to the semiconductor substrate.

As a result, the springs 12 resiliently deform in response to the strain to displace the movable electrodes 10a, 10b. Therefore, the electrode distances between the movable electrodes 10a, 10b and the fixed electrodes 17a, 17b vary to change the capacitances between the movable electrodes 10a, 10b and the fixed electrodes 17a, 17b. As a result, the thermal characteristics in offset voltage deteriorate.

SUMMARY OF THE INVENTION

The present invention has been made in view of the above aspects with an object to provide a capacitive dynamic quantity sensor in which the deterioration of the thermal characteristics in offset voltage caused by the substrate deformation has been suppressed.

To achieve the above object, a capacitive dynamic quantity sensor according to the present invention includes a substrate, a weight, a movable electrode, a movable unit anchor, a fixed electrode, a spring, and a strain buffer. The weight is displaced by a dynamic quantity. The movable electrode is integrated with the weight. The movable unit anchor is fixed to the substrate to suspend the weight and the movable electrode above the substrate. The fixed electrode is arranged to face the movable electrode. The displacement of the movable electrode that is caused in response to the dynamic quantity is detected as a variation in the capacitance between the movable electrode and the fixed electrode. The spring is located between the movable unit anchor and the weight and resiliently deforms in response to the dynamic quantity such that the movable electrode is displaced by a distance corresponding to the dynamic quantity. The strain buffer is located between the movable unit anchor and the spring to reduce the influence of a strain generated in the substrate on the spring.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1A:
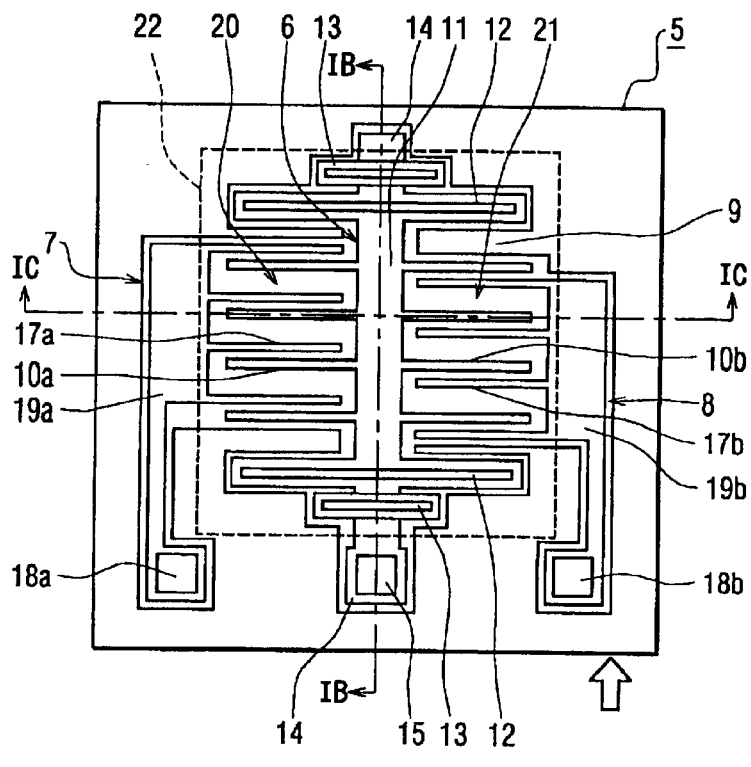
FIG. 1A is a schematic plan view of a capacitive semiconductor acceleration sensor according to a first embodiment of the present invention.
Figure 1B:
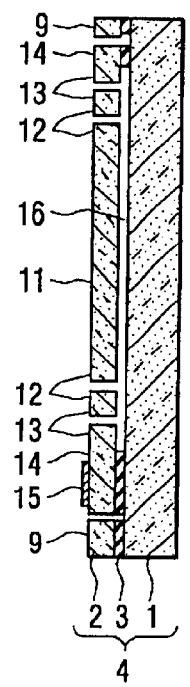
FIG. 1B is a schematic cross-sectional view of the sensor in FIG. 1A taken along the line IB—IB.
Figure 1C:
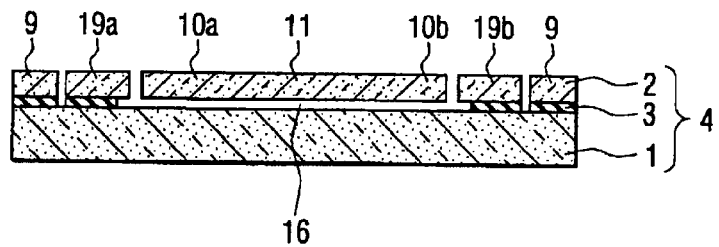
FIG. 1C is a schematic cross-sectional view of the sensor in FIG. 1A taken along the line IC—IC.

As shown in FIGS. 1A to 1C, a semiconductor acceleration sensor 5 according to a first embodiment includes a substrate 4, which has a Silicon-On-Insulator (SOI) structure. The substrate 4 is composed of a semiconductor substrate 1, or a first semiconductor layer 1, a second semiconductor layer 2, and an insulating layer 3, which is a sacrificial layer made of, for example, silicon oxide. The semiconductor layers 1, 2 are made of single crystal silicon. The sensor 5 of FIG. 1A includes a sensing portion, which has been formed by well-known micromachining technology using semiconductor process technology.

As shown in FIG. 1A, the sensing portion 5 includes a movable unit 6, first and second fixed units 7, 8, and peripheral portion 9, which surrounds the movable unit 6 and the fixed units 7, 8. There are predetermined clearances between the movable unit 6, the fixed units 7, 8, and the peripheral portion 9 to insulate them from one another.

The movable unit 6 includes four first comb-tooth-shaped movable electrodes 10a, four second comb-tooth-shaped movable electrodes 10b, a weight 11, two rectangular frame-shaped springs 12, two strain buffers 13, or two strain-buffering springs 13, two movable unit anchors 14, and a movable electrode pad 15. The movable electrodes 10a, 10b are integrated with the weight 11 to extend from two sides of the weight 11 orthogonally to the longitudinal direction of the weight 11. The springs 12 are joined to the weight 11, which is a mass portion on which acceleration acts. Each of the springs 12 has a through-hole, which extends orthogonally to the displacement direction of the movable electrodes 10a, 10b, to be in the shape of a rectangular frame.

The springs 12 are joined to the movable unit anchors 14, which are connected to the first semiconductor layer 1 through the insulating layer 3, through the strain-buffering springs 13, which are rectangular-flame-shaped like the springs 12. In this embodiment, the strain-buffering springs 13 are formed at both ends of the weight 11 with the springs 12 therebetween, as shown in FIG. 1A. However, substantially the same effect can be achieved even if only one strain-buffering spring 13 is formed.

The movable electrodes 10a, 10b, the weight 11, the springs 12, and the strain-buffering springs 13 are spaced apart form the first semiconductor layer 1, as illustrated in FIGS. 1B and 1C. The structure is formed by etching the second semiconductor layer 2 from its surface and consecutively selectively etching the insulating layer 3 to form a space 16 under the second semiconductor layer 2. The outline of the space 16 is illustrated with the dotted line 22 in FIG. 1A. Therefore, the strain-buffering springs 13 are movably supported between the movable unit anchors 14 and the springs 12. Thus, even if the first semiconductor layer 1 deforms due to the influence of temperature, it is possible to relax the strain transmitted through the movable anchors 14 with the strain-buffering springs 13 before the strain is transmitted to the springs 12, which are important for precise acceleration detection. The strain-buffering springs 13 will be described in detail later.

Each of the springs 12 serves as a spring to expand and shrink along the directions orthogonal to the longitudinal direction thereof. Therefore, the weight 11 and the movable electrodes 10a, 10b move in the direction shown by the arrow in FIG. 1A when the sensor 5 is accelerated in that direction and moves back to the original position when the acceleration becomes zero. The movable electrode pad 15 is connected to one of the movable unit anchors 14 at a predetermined position. The movable electrode pad 15 is used for electrically connecting the movable electrodes 10a, 10b to a C-V converter circuit, which is described later.

The first and second fixed units 7, 8 respectively include: four comb-tooth-shaped first fixed electrodes 17a and four comb-tooth-shaped second fixed electrodes 17b; first and second fixed unit anchors 19a, 19b; and first and second fixed electrode pads 18a, 18b. The first and second fixed electrode pads 18a, 18b are respectively located on the first and second fixed unit anchors 19a, 19b for electrically connecting the fixed electrodes 17a, 17b to the C-V converter circuit. The fixed unit anchors 19a, 19b are arranged to be parallel to the longitudinal directions of the weight 11. The first and second fixed electrodes 17a, 17b respectively extend from the first and second fixed unit anchors 19a, 19b to face respectively parallel the first and second movable electrodes 10a, 10b, which extend from the two side of the weight 11, such that a predetermined detection gap is formed between the fixed electrodes 17a, 17b and the movable electrodes 10a, 10b.

The fixed unit anchors 19a, 19b are fixed to the semiconductor substrate 1 with the insulating layer 3 therebetween. The first and second fixed electrodes 17a, 17b are supported at one ends thereof by the first and second fixed unit anchors 19a, 19b. The structure is also formed by etching the second semiconductor layer 2 from its surface and consecutively selectively etching the insulating layer 3 to form the space 16. The first movable electrodes 10a and the first fixed electrodes 15a form a first detection part 20 that provides a first capacitance CS1, and the second movable electrodes 10b and the second fixed electrodes 15b form a second detection part 21 that provides a second capacitance CS2.

The electrodes 10a, 17a, 10b, 17b are arranged such that the capacitance difference $\Delta C$, or (CS1−CS2), between the first and second capacitances CS1 and CS2 becomes substantially zero when no acceleration is applied. When the sensor 5 is accelerated, the springs 12 deform to vary the distances between the movable electrodes 10a, 10b and the fixed electrodes 17a, 17b. Therefore, the first and second capacitances CS1 and CS2 vary with the distance variation. Therefore, the acceleration can be measured by detecting the capacitance difference AC, or (CS1−CS2), between the first and second capacitances CS1 and CS2 as a potential difference using the C-V converter circuit.

Figure 2:
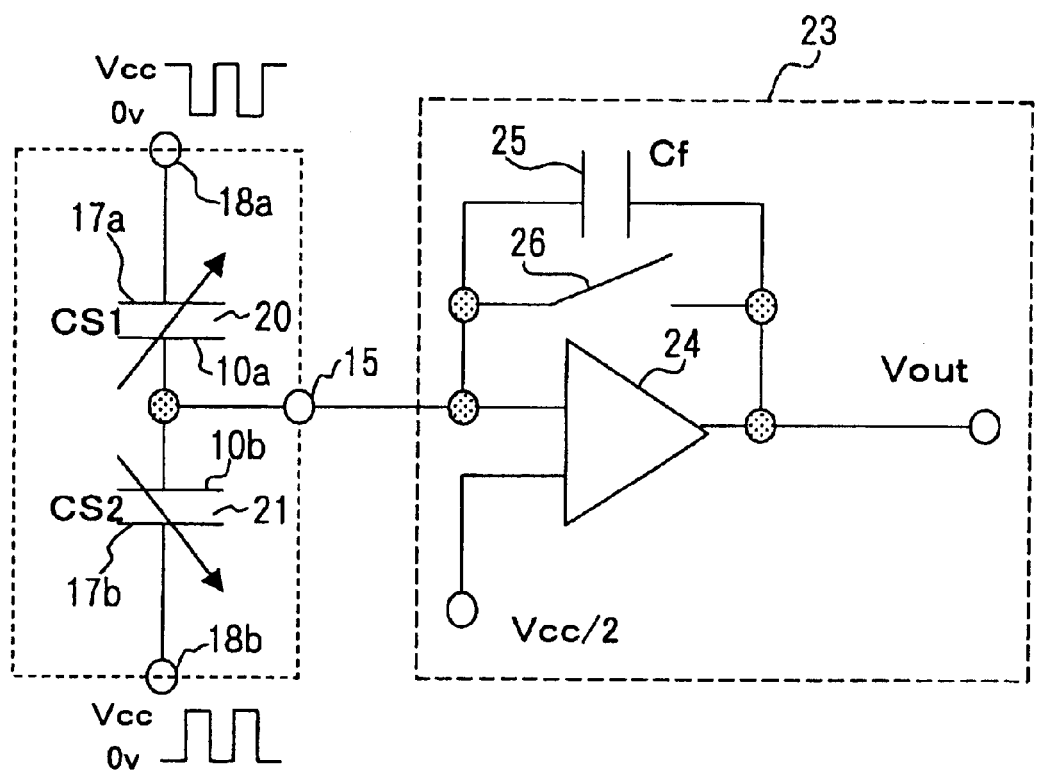
FIG. 2 is an equivalent circuit diagram for a detection circuit for the sensor of FIG. 1A.

FIG. 2 is an equivalent circuit diagram for a detection circuit for the sensor of FIG. 1A. As shown in FIG. 2, the detection circuit includes a C-V converter circuit 23, or a switched capacitor circuit 23. The C-V converter circuit 23 converts the capacitance difference (CS1−CS2) between the first and second capacitances CS1 and CS2 into voltage difference and outputs the voltage difference. The C-V converter circuit 23 includes an operational amplifier 24, a capacitor 25 having a capacitance Cf, and a switch 26.

The inverting input terminal of the operational amplifier 24 is electrically connected to the movable electrodes 10a, 10b through the movable electrode pad 15. The capacitor 25 and the switch 26 are connected in parallel between the inverting input terminal and the output terminal of the operational amplifier 23. A voltage of Vcc/2 is applied from a power source, which is not illustrated in the figure, to the non-inverting input terminal of the operational amplifier 24.

The detection circuit also includes a control circuit, which is not illustrated in the figure. The control circuit inputs a first carrier wave, which has a constant amplitude of Vcc and alternates periodically, from the first fixed electrode pad 18a to the first fixed electrodes 17a of the first detection part 20. At the same time, the control circuit inputs a second carrier wave, which has a constant amplitude of Vcc, the phase of which is shifted by 180° from the first carrier wave, from the second fixed electrode pad 18b to the second fixed electrodes 17b of the second detection part 21.

Therefore, when no acceleration is applied, each potential of the detection parts 20, 21 becomes Vcc/2 because the first capacitance CS1 of the first detection part 20 is substantially equal to the second capacitance CS2 of the second detection part 21. The switch 26 in the C-V converter circuit 23 is turned on and off with predetermined timing that is synchronized with the carrier waves. When the switch 26 is off, acceleration is detected. The C-V converter circuit 23 outputs a voltage of Vout in response to the acceleration. Vout is expressed by the following equation eq. 1.

$$Vout=(CS1-CS2) \times Vcc/Cf \qquad \text{eq. 1}$$

When the sensor is accelerated, the ratio of the first capacitance CS1 to the second capacitance CS2 varies and. Vout, which is proportionate to the capacitive difference (CS1−CS2) as understood by eq. 3, is outputted. The outputted voltage is processed by an amplification circuit or low-pass filter, which is not illustrated in the figure, and detected as an acceleration detection signal.

Although a voltage of Vcc/2 is applied from a power source, which is not illustrated in the figure, to the non-inverting input terminal of the operational amplifier 24, a voltage of V1, which is not equal to Vcc/2, may be provided in order to create a self-diagnosis function, in which the movable electrode 10a, 10b are forcedly displaced by switching Vcc/2 to V1 using a switch, which is not illustrated in the figure, with predetermined timing that is synchronized with the carrier waves.

Figure 3A:
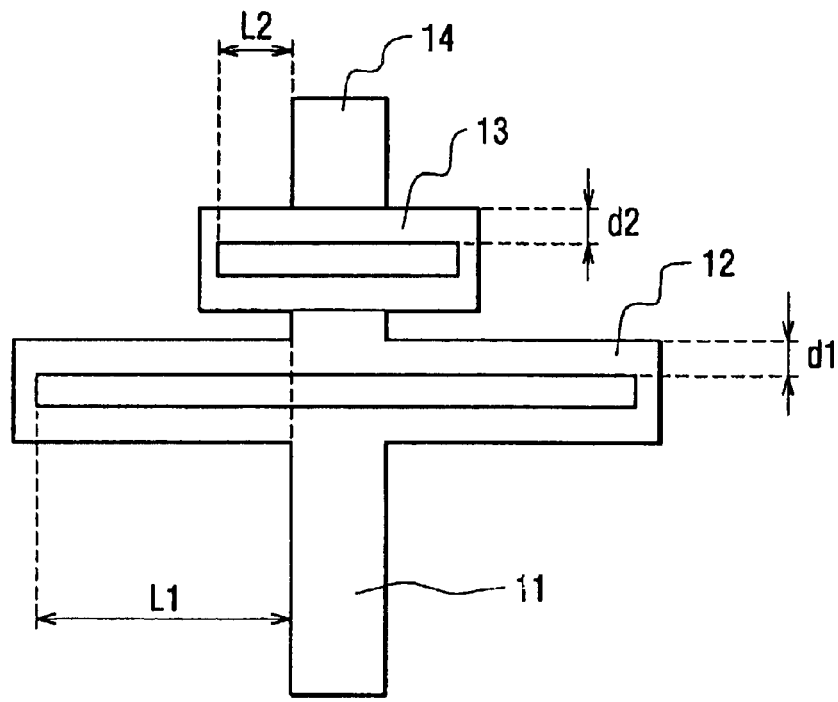
FIG. 3A is an enlarged view of the springs and the strain buffer in FIG. 1A showing the initial state.

The present invention is characterized in that the strain buffers 13, or the strain-buffering springs 13, are provided between the springs 12 and the movable unit anchors 14 in the movable unit 6 as shown in FIG. 3A. The first semiconductor layer 1 of the sensor chip deforms due to the difference in linear expansion coefficient between the printed circuit board 31, the sensor package 29, the adhesives 28, 30, and the sensor chip 5 if they are heated in the assembly of the device shown in FIG. 4B or in use. In the sensor of FIGS. 1A to 1C, the strain caused by the deformation of the first semiconductor layer 1 is transmitted to the movable unit anchors 14, which are joined to the first semiconductor layer 1 through the insulating layer 3, and, as shown in FIG. 3B, the movable unit anchors 14 become the start points of the transmitted strain, which is denoted by an oval in FIG. 3B.

Figure 4A:
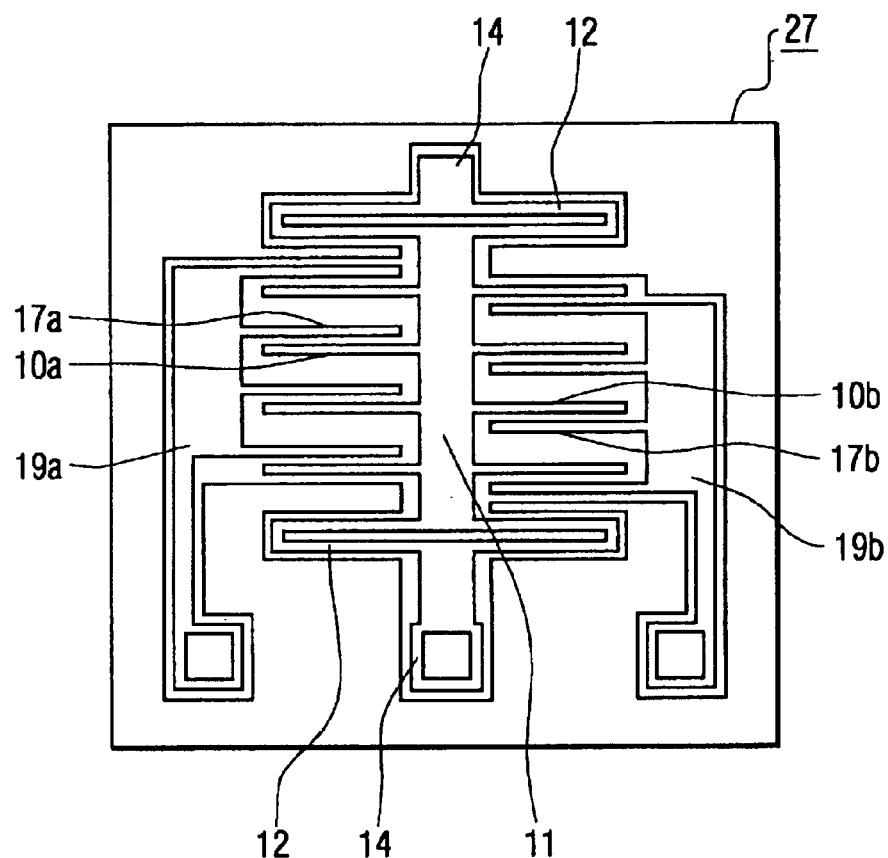
FIG. 4A is a schematic plan view of a proposed capacitive semiconductor acceleration sensor.

In the proposed sensor 27 of FIG. 4A, the strain caused by the deformation of the first semiconductor layer 1 directly acts on the springs 12 to cause it to resiliently deform. As a result, the movable electrodes 10a, 10b are displaced and shift from the initial position. In contrast, in the sensor of FIGS. 1A to 1C, each of the springs 12, which are connected to the weight 11, and the strain-buffering springs 13, which are provided between the springs 12 and the movable unit anchors 14, serves as a spring to expand and shrink along the directions orthogonal to the longitudinal direction thereof.

Figure 3B:
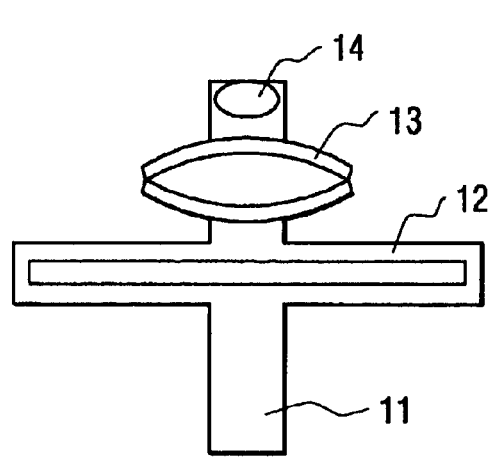
FIG. 3B is an enlarged view of the springs and the strain buffer in FIG. 1A showing the state when the first semiconductor layer deforms.
Figure 4B:
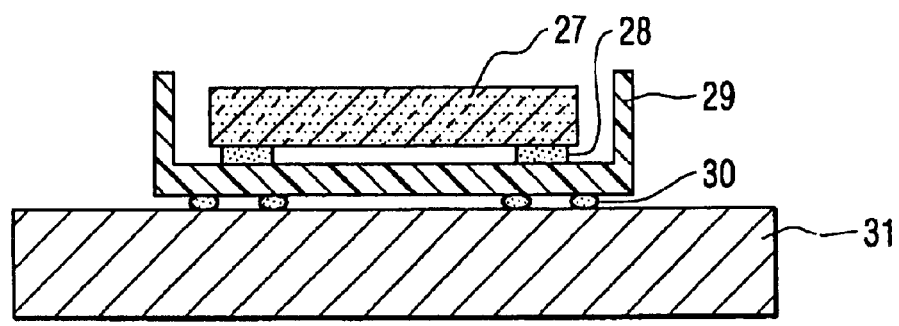
FIG. 4B is a schematic cross-sectional view showing the state that the sensor of FIG. 4A is assembled on a printed circuit board.

As illustrated in FIG. 3B, since the strain-buffering springs 13 are provided between the springs 12 and the movable unit anchors 14 to serve as springs, the strain-buffering springs 13 resiliently deform due to the strain to relax the strain before the strain acts on the springs 12. Therefore, it is possible to reduce the influence of the strain caused by the deformation of the first semiconductor layer 1 on the springs 12.

Figure 3C:
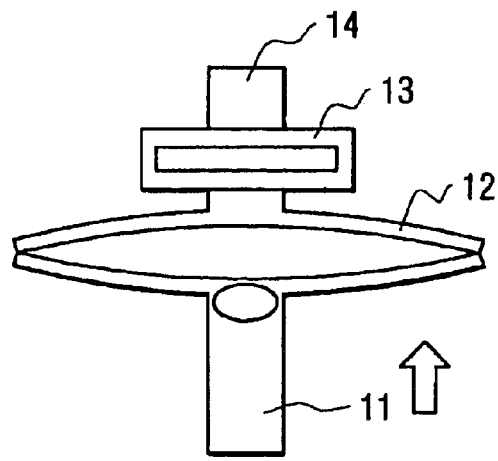
FIG. 3C is an enlarged view of the springs and the strain buffer in FIG. 1A showing the state when acceleration is applied.

When acceleration is applied along the direction illustrated by an arrow in FIG. 3C, which is orthogonal to the longitudinal direction of the springs 12, the weight 11, which is a mass portion, is affected by the acceleration. Since the springs 12, which are connected to the weight 11, serve as springs, the start points of the displacement becomes the portion that is denoted by an oval in FIG. 3C. Therefore, the rectangular-frame-like springs 12 resiliently deform to absorb the energy.

However, as described above, the strain-buffering springs 13, which are connected to the springs 12, serve as springs to expand and shrink along the directions parallel to the longitudinal direction of the weight 11. Therefore, if the strain-buffering springs 13 resiliently deform due to the applied acceleration, the displacement amount of the movable electrodes 10a, 10b change in response to the deformation. Thus, the influence of the strain-buffering springs 13 on the displacement of the movable electrodes 10a, 10b needs to be in the error range of the influence of the strain-buffering springs 13 on the displacement of the movable electrodes 10a, 10b.

The displacement amount of the movable electrodes 10a, 10b due to the resilient deformations of the springs 12 and the strain-buffering springs 13 caused by the acceleration that acts on the weight 11 is proportionate to each spring constant of the springs 12 and the strain-buffering springs 13. Therefore, the spring constant of the strain-buffering springs 13 needs to be greater than that of the springs 12 in order to make the movable electrodes 10a, 10b free from the influence of the strain-buffering springs 13 when acceleration is detected.

If the influence of the strain-buffering springs 13 on the displacement of the movable electrodes 10a, 10b is 1%, which is the error range of the influence of the strain-buffering springs 13 on the displacement of the movable electrodes 10a, 10b, in order to make the movable electrodes 10a, 10b substantially free from the influence of the strain-buffering springs 13 when acceleration is detected, the spring constant K1 of the springs 12 and the spring constant K2 of the strain-buffering springs 13 need to satisfy the following equation eq. 2.

$$K2 \geq 2\,K1 \times 100 \qquad \text{eq.2}$$

Therefore, if the springs 12 and the strain-buffering springs 13 are formed to satisfy eq. 2, the influence of the strain-buffering springs 13 on the displacement of the movable electrodes 10a, 10b when acceleration is applied becomes negligible in comparison with that of the springs 12.

The spring constant is proportionate to the third power of its width and its thickness, or its height, and inversely proportionate to the third power of its length. Therefore, for example, if the width and the thickness of the springs 12 are substantially equal to those of the strain-buffering springs 13, the springs 12 and the strain-buffering springs 13 are formed to satisfy the following equation eq. 3, $$L1/L2 > 4.7 \qquad \text{eq. 3}$$

where L1 and L2 are respectively the length of the frame of the springs 12 and the length of the frame of the strain-buffering springs 13 in the directions orthogonal to the displacement direction of the movable electrodes 10a, 10b, as shown in FIG. 3A.

That is, if the length L1 of the springs 12 is set to be 4.7 times or more greater than the length L2 of the strain-buffering springs 13 to satisfy eq. 3, the influence of the strain-buffering springs 13 on the displacement of the movable electrodes 10a, 10b becomes 1% or lower even when the strain-buffering springs 13 resiliently deform due to the applied acceleration, and the influence of the strain-buffering springs 13 on the displacement of the movable electrodes 10a, 10b when acceleration is applied becomes negligible in comparison with that of the springs 12.

In this embodiment, the strain-buffering springs 13, which have a predetermined resiliency, are provided to relax the strain caused by the deformation of the first semiconductor layer 1 by absorbing the strain using the resilient deformation of the strain-buffering springs 13. Therefore, the strain caused by the deformation of the first semiconductor layer 1 is less transmitted to the springs 12. As a result, the movable electrodes 10a, 10b are hardly displaced by the strain, so it is possible to reduce the variation in offset voltage caused by the strain.

Other Embodiments

In the above embodiment, it is the length L1 of the springs 12 and the length L2 of the strain-buffering springs 13 that are adjusted such that the strain-buffering springs 13 does not affect the acceleration measurement. Alternatively, if the length and the thickness of the springs 12 are substantially equal to those of the strain-buffering springs 13, the springs 12 and the strain-buffering springs 13 are formed to satisfy the following equation eq. 4, $$d2/d1 > 4.7 \qquad \text{eq. 4}$$

where d1 and d2 are respectively the width of the frame of the springs 12 and the width of the frame of the strain-buffering springs 13 in the directions parallel to the displacement direction of the movable electrodes 10a, 10b, as shown in FIG. 3A.

That is, if the width d2 of the strain-buffering springs 13 is set to be 4.7 times or more greater than the width d1 of the springs 12 to satisfy eq. 4, the influence of the strain-buffering springs 13 on the displacement of the movable electrodes 10a, 10b becomes 1% or lower even when the strain-buffering springs 13 resiliently deform due to the applied acceleration, and the influence of the strain-buffering springs 13 on the displacement of the movable electrodes 10a, 10b when acceleration is applied becomes negligible in comparison with that of the springs 12.

In the above embodiments, the lengths L1 and L2 and the widths d1 and d2 are discretely varied. However, as a matter of course, the lengths L1 and L2 and the widths d1 and d2 may be simultaneously adjusted to satisfy eq. 2.

The semiconductor acceleration sensor of FIGS. 1A to 1C is manufactured by etching the second semiconductor layer 2 and the insulating layer 3 from the surface of the second semiconductor layer 2. However, the present invention can be applied to a semiconductor sensor that is formed by etching the second semiconductor layer 2 alone from the surface thereof and a semiconductor sensor, the diaphragm such as a movable electrode of which is formed by etching the first semiconductor layer 1 of the sensor from its surface, or from its non-insulating-layer side.

In the first embodiment, the strain-buffering springs 13 are rectangular-flame-shaped. However, the strain-buffering springs 13 may have other structure as long as it can absorb the strain transmitted from the first semiconductor layer 1. For example, a multiply folding structure may be used.

What is claimed is:

1. A capacitive dynamic quantity sensor comprising:
   a substrate;
   a weight, which is displaced by a dynamic quantity;
   a movable electrode, which is integrated with the weight;
   a first movable unit anchor, which is fixed to the substrate to suspend the weight and the movable electrode above the substrate;
   a fixed electrode, which is arranged to face the movable electrode, wherein a displacement of the movable electrode that is caused in response to the dynamic quantity is detected as a variation in a capacitance between the movable electrode and the fixed electrode;
   a first spring, which is located between the first movable unit anchor and the weight and resiliently deforms in response to the dynamic quantity such that the movable electrode is displaced by a distance corresponding to the dynamic quantity; and
   a first strain buffer, which is located between the first movable unit anchor and the first spring to reduce an influence of a strain generated in the substrate on the first spring.

2. The sensor according to claim 1 further comprising:
   a second movable unit anchor, which is fixed to the substrate to suspend the weight and the movable electrode above the substrate;
   a second spring, which is located between the second movable unit anchor and weight and resiliently deforms in response to the dynamic quantity such that the movable electrode is displaced by the distance corresponding to the dynamic quantity; and
   a second strain buffer, which is located between the second movable unit anchor and the second spring to reduce the influence of the strain, wherein the springs are linked to the weight at two opposite ends of the weight.

3. The sensor according to claim 1, wherein the first strain buffer is a strain-buffering spring that resiliently deforms to absorb the strain and wherein the strain-buffering spring has a spring constant greater than that of the first spring.

4. The sensor according to claim 3, wherein the spring constants of the first spring and the strain-buffering spring satisfy an equation, $$K2 \geq K1 \times 100$$

where K1 and K2 are the spring constant of the first spring and the spring constant of the strain-buffering spring, respectively.

5. The sensor according to claim 3, wherein each of the first spring and the strain-buffering spring is in a shape of a rectangular frame that has a through-hole that extends orthogonally to a displacement direction of the movable electrode and wherein the first spring and the strain-buffering spring are different from each other in one dimension selected from the group consisting of a length of the frame in directions orthogonal to the displacement direction and a width of the frame in the direction parallel to the displacement direction such that the strain-buffering spring has a spring constant greater than that of the first spring.

6. The sensor according to claim 5, wherein the first spring and the strain-buffering spring have substantially the same frame width and wherein the frame length of the first spring is 4.7 times or more greater than the frame length of the strain-buffering spring.

* * * * *